United States Patent [19]

Ellis et al.

[11] Patent Number: 4,542,310
[45] Date of Patent: Sep. 17, 1985

[54] CMOS BOOTSTRAPPED PULL UP CIRCUIT

[75] Inventors: Wayne F. Ellis, Jericho; William R. Griffin, South Burlington; Ronald R. Troutman, Essex Junction, all of Vt.

[73] Assignee: International Business Machines Corporation, Armonk, N.Y.

[21] Appl. No.: 508,999

[22] Filed: Jun. 29, 1983

[51] Int. Cl.[4] .............. H03K 19/003; H03K 19/017; H03K 19/096; H03K 17/06
[52] U.S. Cl. .................... 307/578; 307/482; 307/452; 307/473; 307/579; 307/585; 307/270
[58] Field of Search ............. 307/450, 451, 452, 453, 307/475, 473, 482, 576, 578, 579, 583, 585, 270, 601, 605

[56] References Cited

U.S. PATENT DOCUMENTS

| | | | |
|---|---|---|---|
| 3,806,738 | 4/1974 | Chin et al. | 307/228 |
| 3,872,321 | 3/1975 | Matsue | 307/205 |
| 3,898,479 | 8/1975 | Proebsting | 307/482 |
| 3,988,617 | 10/1976 | Price | 307/270 |
| 4,042,838 | 8/1977 | Street et al. | 307/270 |
| 4,071,783 | 1/1978 | Knepper | 307/270 |
| 4,395,644 | 7/1983 | Misaizu | 307/578 X |
| 4,443,715 | 4/1984 | Fox | 307/482 X |
| 4,443,720 | 4/1984 | Takemae | 307/578 |

OTHER PUBLICATIONS

Sonoda, "MOS Powering Circuit", IBM Tech. Discl. Bull., vol. 13, No. 9, p. 2658, Feb. 1971.
Gabric et al., "MOS Self-bootstrapping Inverter Driver Circuit", IBM Tech. Discl. Bull., vol. 24, No. 10, pp. 5055-5056, Mar. 1982.

Primary Examiner—Stanley D. Miller
Assistant Examiner—David R. Bertelson
Attorney, Agent, or Firm—Stephen J. Limanek

[57] ABSTRACT

A CMOS driver or pull up circuit is provided which includes a pull up transistor of a given conductivity type and a precharged bootstrap capacitor which discharges fully through a second transistor having a conductivity type opposite to that of the pull up transistor to the control gate or electrode of the pull up transistor. A third transistor may be used to initiate discharge by providing power supply voltage to the control gate of the pull up transistor.

17 Claims, 2 Drawing Figures

CMOS BOOTSTRAPPED PULL UP CIRCUIT

TECHNICAL FIELD

This invention relates to integrated semiconductor circuits and more particularly to complementary metal oxide semiconductor (CMOS) or complementary field effect transistor circuits which are used as driver or pull up circuits.

BACKGROUND ART

Integrated semiconductor driver circuits using N channel field effect transistors including a pull up device and a direct bootstrap capacitor arrangement for applying a full power supply voltage to an output terminal are taught in, e.g., U.S. Pat. No. 3,872,321, filed on Sep. 21, 1973.

In commonly assigned U.S. Pat. No. 3,806,738, filed on Dec. 29, 1972, by W. B. Chin and T. S. Jen, there is disclosed a driver circuit using non-complementary devices which requires a two bootstrap capacitor arrangement.

Commonly assigned U.S. Pat. No. 3,988,617, filed on Dec. 23, 1974, by C. A. Price, discloses a circuit wherein a bootstrap bias voltage circuit is isolated from an output terminal but consumes direct current power.

In another commonly assigned U.S. Pat. No. 4,071,783, filed on Nov. 19, 1976, by R. W. Knepper, there is described a driver circuit capable of providing full supply voltage signal swings but which requires both enhancement and depletion devices, consumes direct current power and does not have very high performance.

U.S. Pat. No. 4,042,838, filed July 28, 1976, describes a driver circuit having two bootstrap capacitors, one of which is discharged through an N channel device to the control electrode of a pull up device to drive an output terminal to the full power supply voltage.

DISCLOSURE OF THE INVENTION

It is an object of this invention to provide an improved driver circuit which is faster and has more efficiency for bootstrap operation than known driver circuits. This driver circuit has the full bootstrap voltage applied to the pull up device, no direct current power loss and small size, while being less sensitive to process tolerances.

In accordance with the teachings of this invention, an improved CMOS driver or pull up circuit is provided which includes a pull up transistor of a given conductivity type and a bootstrap capacitor which discharges through a second transistor having a conductivity type opposite to that of the pull up transistor to the control gate or electrode of the pull up transistor.

More specifically, the pull up circuit includes a first field effect transistor of a given conductivity type connected between an output terminal and a point of reference potential, serially arranged second and third transistors connected between the point of reference potential and the control gate of the first transistor, the third transistor being of a conductivity type opposite to that of the first transistor and being interposed between the second transistor and the control gate of the first transistor. A bootstrap capacitor is connected between the output terminal and the common point between the second and third transistors. A fourth field effect transistor is arranged in parallel with the serially arranged second and third transistors to apply a voltage to the control gate of the first transistor from the first point of reference potential. A fifth transistor is provided to selectively connect the control gate of the first transistor to a second point of reference potential for discharging the first transistor control gate. Data and $\overline{\text{data}}$ terminals are provided for applying control pulses to the control gates of the transistors.

Also, the driver or pull up circuit of the present invention may be arranged so as to require only a single data input terminal for operation, with a complementary signal, $\overline{\text{data}}$, being generated within the circuit. This circuit may be further arranged to provide a tri-state or high impedance state at its output terminal with the use of an enable pulse.

The foregoing and other objects, features and advantages of the invention will be apparent from the following and more particular description of the preferred embodiments of the invention, as illustrated in the accompanying drawing.

BEST MODE FOR CARRYING OUT THE INVENTION

Figure 1:
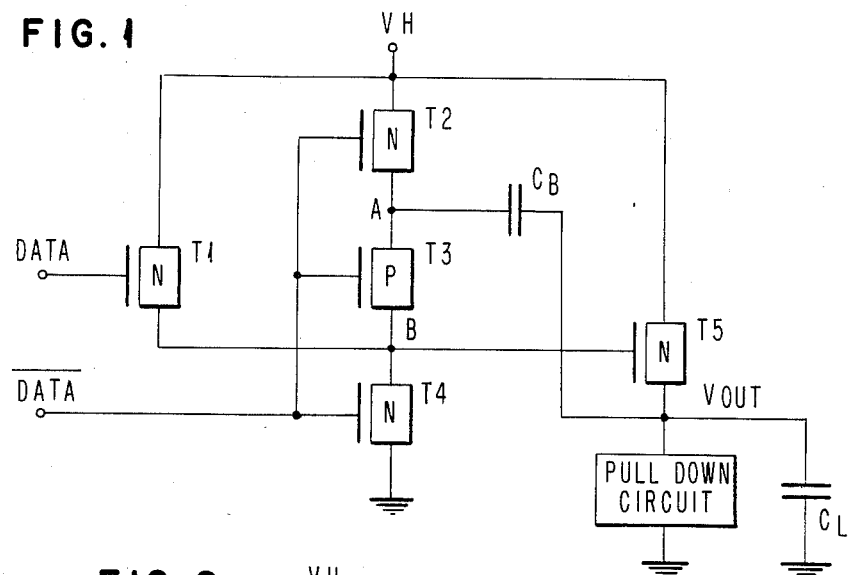
FIG. 1 illustrates the basic circuit of the present invention.

Referring to the drawing in more detail, there is illustrated in FIG. 1 the basic driver or pull up circuit of the present invention which includes a first transistor T1 having a control gate to which a data terminal is connected. A series circuit including second, third and fourth transistors T2, T3 and T4, respectively, is connected between first and second points of reference potential, wherein the first point of reference potential has a positive voltage $V_H$ of, e.g., +5 volts, applied thereto and the second point of reference is, e.g., at ground. A $\overline{\text{data}}$ terminal is connected to the control gates of each of the transistors T2, T3 and T4. A fifth transistor T5 acting as a pull up device, is connected between the first point of reference potential $V_H$ and an output terminal $V_{OUT}$, to which is also connected a load capacitor $C_L$ at one electrode or plate thereof with its second electrode being connected to ground. A pull down circuit, which may be any appropriate switching means, such as another transistor, is connected across the load capacitor $C_L$ to selectively discharge the capacitor $C_L$. A bootstrap capacitor $C_B$ is connected from the output terminal $V_{OUT}$ to the common point, node A, located between the second and third transistors T2 and T3. The first transistor T1 is connected from the first point of reference potential $V_H$ to the common point, node B, located between the third and fourth transistors T3 and T4. The third transistor T3 is a P channel field effect transistor, whereas each of the remaining transistors, T1, T2, T4 and T5 are N channel field effect transistors.

In the operation of the pull up circuit, when the voltage at the $\overline{\text{data}}$ terminal is high, e.g., at +5 volts, and the voltage at the data terminal is low, transistors T2 and T4 turn on and transistors T1, T3 and T5 are off. With transistor T2 on and transistor T3 off, node A is precharged to the supply voltage $V_H$ minus the threshold voltage $V_T$ of transistor T2, or to approximately +4 volts, with the voltage at terminal $V_{OUT}$ preferably pulled low toward ground through the pull down circuit. When the voltage at the $\overline{\text{data}}$ terminal is low, e.g., at ground, and the voltage at the data terminal is high, transistors T1, T3 and T5 turn on and transistors T2 and T4 turn off. Since transistor T1 is on, node B is charged to the voltage $V_H - V_T$, where $V_T$ is the threshold voltage of transistor T1, turning on the pull up transistor T5. With transistor T5 on, the voltage at the output terminal $V_{OUT}$, and thus across the load capacitor $C_L$, begins to increase and bootstrapping action on node A occurs through bootstrap capacitor $C_B$, increasing the voltage at node A to approximately 9 volts. Since transistor T3 is a P channel transistor the entire voltage at node A passes to the gate electrode of the pull up transistor T5 allowing transistor T5 to conduct linearly, increasing the voltage at the output terminal $V_{OUT}$ to the full power supply voltage $V_H$. It should be noted that no direct current power is dissipated in the circuit during this operation.

If desired, data and $\overline{\text{data}}$ terminals may be interchanged to provide an inverted output. It should be understood that the second transistor T2 may be an enhancement, zero threshold or depletion N channel device. Transistor T2 may even be a P channel transistor if the N well or pocket containing the P channel transistor T2 is biased so as to maintain the source/drain to pocket diodes formed therein in a reverse biased condition. If transistor T2 is a P channel transistor, its control electrode or gate would be connected to the data terminal rather than to the $\overline{\text{data}}$ terminal. A P channel transistor T2 has the advantage of precharging node A to the full supply voltage $V_H$.

To insure reverse biased junctions, the N well or pocket in which the P channel transistor T3 is formed is connected directly to node A. If transistor T2 is a P channel device, the N well in which it is formed may be the same as the N well in which transistor T3 is formed.

Figure 2:
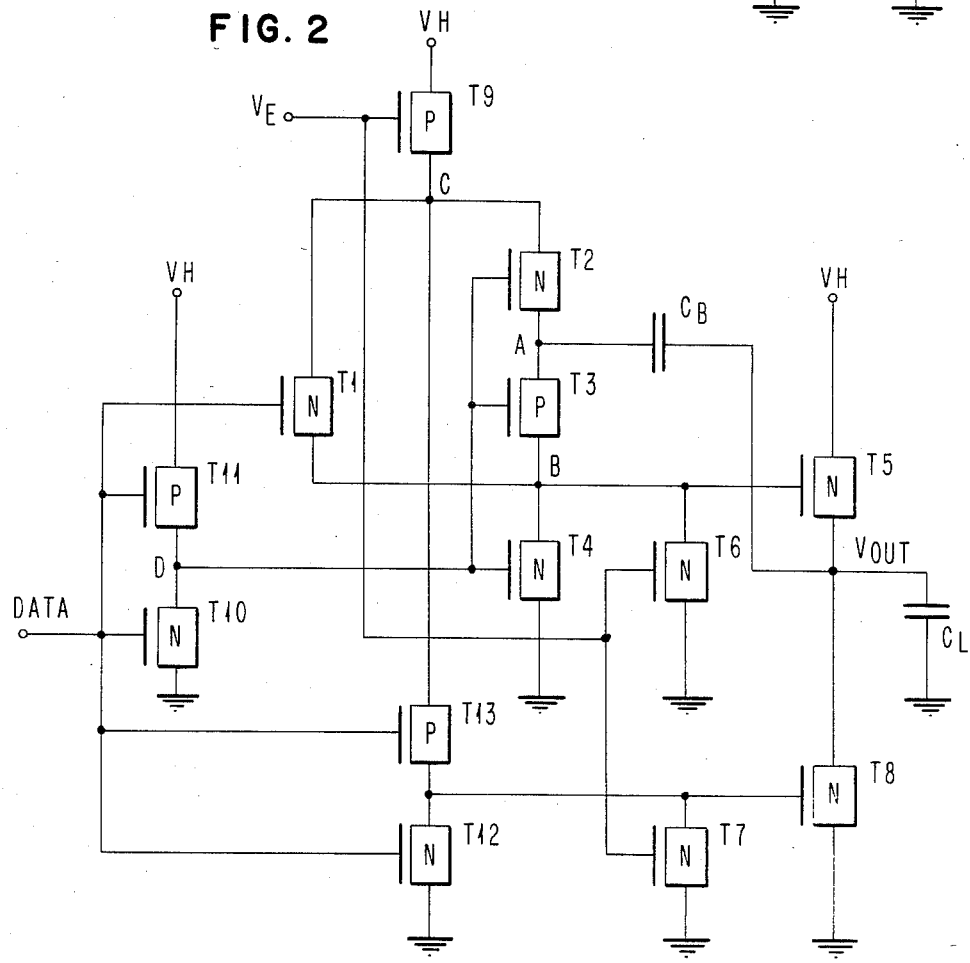
FIG. 2 illustrates the basic circuit of the invention arranged to provide a tri-state output.

In FIG. 2 of the drawing, there is illustrated a tri-state driver or pull up circuit of the present invention which generates its own $\overline{\text{data}}$ signal and uses an enable pulse $V_E$. When the enable pulse at terminal $V_E$ is low, e.g., at ground, N channel field effect transistors T6 and T7 are off, with N channel pull up transistor T5 and N channel pull down transistor T8 being controlled by the data signal applied to DATA terminal, and P channel transistor T9 is on charging node C to voltage $V_H$. When the voltage at the DATA terminal is low, N channel transistor T10 and P channel transistor T11, acting as an inverter, generate a $\overline{\text{data}}$ signal at node D, which is applied to the control electrodes of transistor T2, T3 and T4. Since the data signal at node D is high, node A becomes precharged in the manner described hereinabove in connection with the driver circuit of FIG. 1. It can be further seen that with the data signal at DATA terminal low, the N channel transistor T12 is off and the P channel transistor T13 is on, applying the voltage $V_H$ at node C to the control gate of transistor T8, substantially grounding output terminal $V_{OUT}$.

When the voltage at the DATA terminal goes to a high value, the first transistor T1 turns on allowing the voltage $V_H$ at node C to charge node B, turning on pull up transistor T5. With transistor T5 on, the voltage at the output terminal $V_{OUT}$, and thus across the load capacitor $C_L$, begins to increase and bootstrapping action on node A occurs through bootstrap capacitor $C_B$, rapidly increasing the voltage at node A to a value well in excess of the voltage $V_H$ plus a threshold voltage $V_T$ to overdrive the transistor T5. This overdrive condition produces the supply voltage $V_H$ at the output terminal $V_{OUT}$ in a manner similar to that described hereinabove in connection with the driver circuit of FIG. 1. It should be noted that with a high voltage on the DATA terminal, transistor T12 is on, which causes pull down transistor T8 to be off when the output terminal $V_{OUT}$ is being charged to the voltage $V_H$.

To set the driver circuit of FIG. 2 in its tri-state, i.e., to provide a high impedance state at the output terminal $V_{OUT}$, the enable pulse $V_E$ is high, turning off P channel transistor T9 and turning on N channel transistors T6 and T7 which turn off pull up transistor T5 and pull down transistor T8, respectively.

It can be seen that the driver circuit of FIG. 2 is a CMOS bootstrapped driver or pull up circuit providing tri-state conditions. This circuit has significant advantages over driver circuits using P channel pull up devices. Due to reduced mobility of holes versus electrons, the size of the P channel pull up device or transistor becomes very large in large load applications. A bootstrapped N channel pull up device has higher mobility and drive capability per given area resulting in less capacitance being encountered by steering logic signals. Furthermore, it should be understood that a P channel pull up device is susceptible to an undesirable latch up phenomenon in off chip drivers from transmission line reflections and power supply bounce.

It should also be understood that the circuit of the present invention may be modified by those skilled in the art by, e.g., using a negative power supply voltage and substituting for the disclosed transistors, transistors of opposite conductivity type.

While the invention has been particularly shown and described with reference to preferred embodiments thereof, it will be understood by those skilled in the art that various changes in form and details may be made therein without departing from the spirit and scope of the invention.

What is claimed is:

1. A pull up circuit comprising
   a first field effect transistor,
   an impedance serially connected with said transistor at an output terminal disposed between first and second points of reference potential,
   second and third serially arranged field effect transistors connected between said first point of reference potential and a control electrode of said first transistor, said second transistor being of a given conductivity type interposed between said third transistor and said control electrode and said first transistor being of a conductivity type opposite to that of said given conductivity type,
   a first capacitor connected between said output terminal and a common point located between said second and third transistors, and
   means for selectively applying voltage pulses to the control electrodes of said transistors.

2. A pull up circuit as set forth in claim 1 wherein said first and third transistors are N channel field effect transistors and said second transistor is a P channel field effect transistor.

3. A pull up circuit as set forth in claim 2 wherein said voltage applying means includes a common node connected to the control electrodes of said second and third transistors.

4. A pull up circuit as set forth in claim 3 wherein said impedance is a second capacitor.

5. A pull up circuit as set forth in claim 4 further including means for selectively discharging said second capacitor.

6. A pull up circuit as set forth in claim 5 further including a fourth transistor serially connected with said second and third transistors and disposed between the control electrode of said first transistor and said second point of reference potential.

7. A pull up circuit as set forth in claim 6 wherein said fourth transistor is an N channel transistor and has a control electrode connected to said common node.

8. A pull up circuit as set forth in claim 1 further including a fourth transistor connected between said first point of reference potential and the control electrode of said first transistor.

9. A pull up circuit as set forth in claim 8 wherein said first, third and fourth transistors are N channel transistors and said second transistor is a P channel transistor.

10. A pull up circuit comprising
first, second and third serially arranged field effect transistors connected between first and second points of reference potential, said second transistor being of a given conductivity type and said first and third transistors being of a conductivity type opposite to that of said given conductivity type transistor,
a fourth transistor connected between said first point of reference potential and an output terminal and having a control electrode connected to the common point between said second and third transistors,
a first capacitor connected between said output terminal and the common point between said first and second transistors, and
means for selectively applying voltage pulses to the control electrodes of said transistors.

11. A pull up circuit as set forth in claim 10 wherein said first and third transistors are N channel transistors and said second transistor is a P channel transistor and further including a second capacitor connected between said output terminal and said second point of reference potential.

12. A pull up circuit as set forth in claim 11 wherein said voltage pulse applying means includes a common node connected to the control electrodes of said first, second and third transistors.

13. A pull up circuit as set forth in claim 10 further including a fifth transistor connected between said first point of reference potential and the control electrode of said fourth transistor.

14. A pull up circuit as set forth in claim 13 wherein said first, third, fourth and fifth transistors are N channel transistors and said second transistor is a P channel transistor.

15. A pull up circuit as set forth in claim 14 wherein said voltage pulse applying means includes a common node connected to the control electrodes of said first, second and third transistors and means for applying complementary data signals to said common node and to the control electrode of said fifth transistor.

16. A pull up circuit as set forth in claim 15 further including a pull down transistor connected between said output terminal and said second point of reference potential, a sixth transistor connected between the control electrode of said fourth transistor and said second point of reference potential, a seventh transistor connected between the control electrode of said pull down transistor and said second point of reference potential and an eighth transistor connected between said first point of reference potential and said first transistor, said pull down, sixth and seventh transistors being N channel transistors and said eighth transistor being a P channel transistor, and means for applying enabling pulses to the control electrodes of said sixth, seventh and eighth transistors.

17. A pull up circuit as set forth in claim 16 wherein said voltage pulse applying means further includes first and second inverter circuits each having an N channel transistor and a P channel transistor serially arranged and a data terminal coupled to the control electrodes of said inverter circuits transistors, the common point between said N channel and P channel transistors of said first inverter circuit being connected to the control electrode of said third transistor and the common point between said N channel and P channel transistors of said second inverter circuit being connected to the control electrode of said pull down transistor.

* * * * *